United States Patent [19]

Walton

[11] Patent Number: 4,496,423

[45] Date of Patent: Jan. 29, 1985

[54] GAS FEED FOR REACTIVE ION ETCH SYSTEM

[75] Inventor: Frank J. Walton, Sunnyvale, Calif.

[73] Assignee: GCA Corporation, Bedford, Mass.

[21] Appl. No.: 550,801

[22] Filed: Nov. 14, 1983

[51] Int. Cl.³ .................. H01L 21/306; C23F 1/00
[52] U.S. Cl. ........................... 156/345; 156/643; 156/646; 204/298
[58] Field of Search ............... 156/345, 643, 646; 204/298, 192 E

[56] References Cited

U.S. PATENT DOCUMENTS 4,270,999 6/1981 Hassan et al. .................. 156/345 X
4,313,783 2/1982 Davies et al. .................. 156/345 X Primary Examiner—William A. Powell
Attorney, Agent, or Firm—Kenway & Jenney

[57] ABSTRACT

The gas feed system disclosed herein is useful in a reactive ion etching system in which a gas plasma is energized by an electrode plate through which the gas is introduced. Propagation of the plasma discharge down the gas feed path is blocked by a feed system in which the space between a pair of porous metal plugs is filled with a porous insulating material having a pore size too small to support discharge, i.e. corresponding to the mean free electron path in the gas.

8 Claims, 3 Drawing Figures

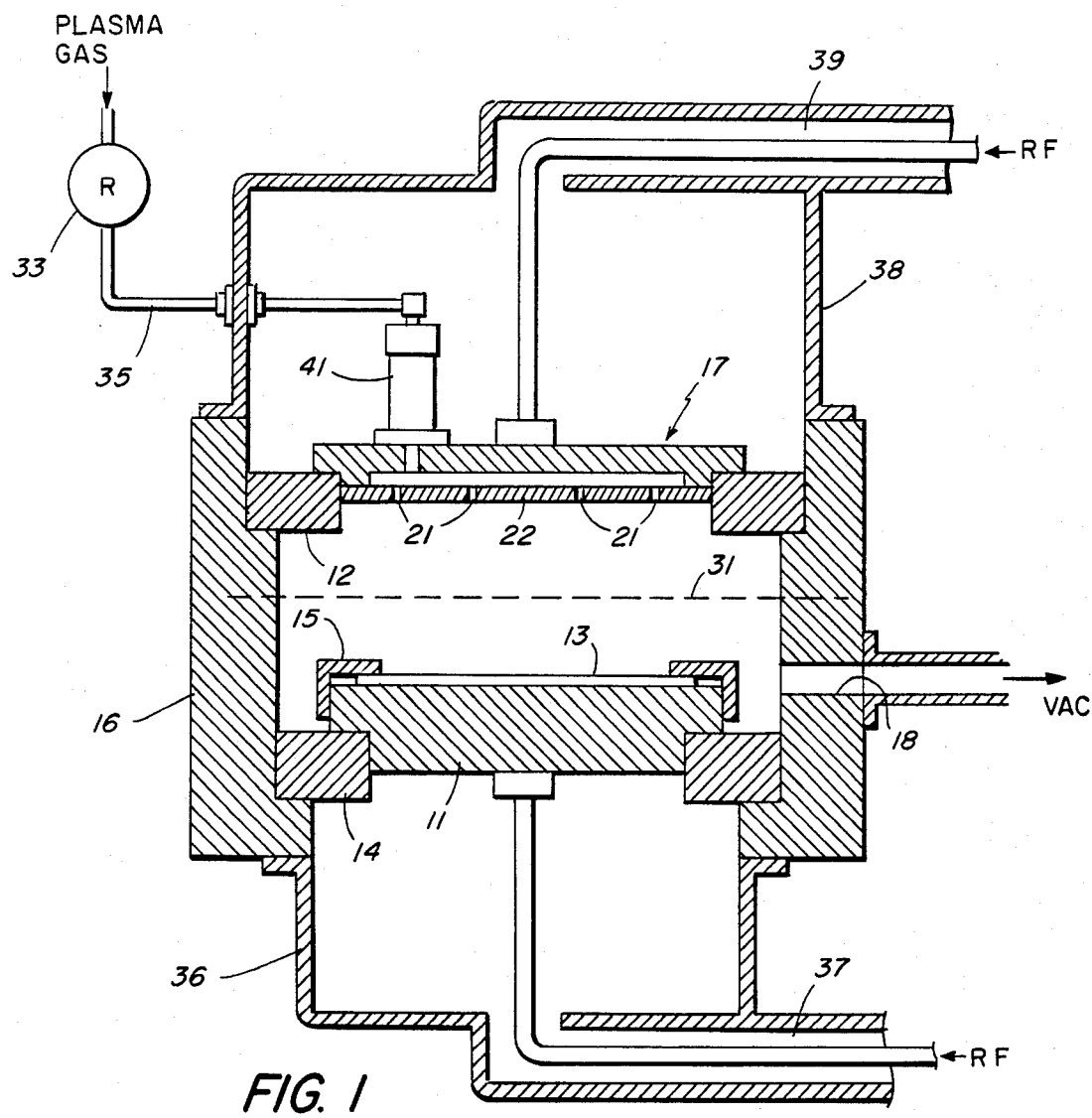
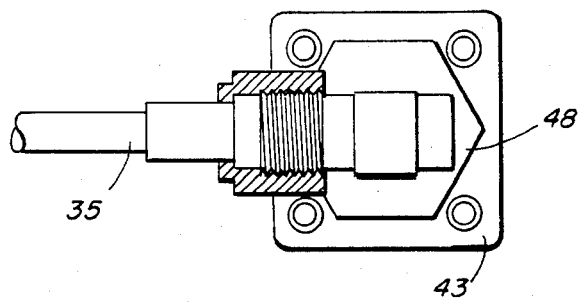
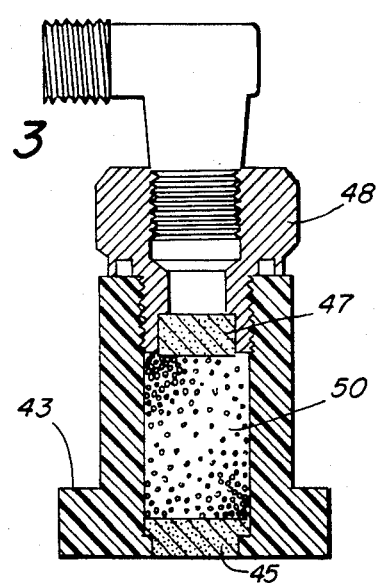
FIG. 1
FIG. 2
FIG. 3

GAS FEED FOR REACTIVE ION ETCH SYSTEM

BACKGROUND OF THE INVENTION

The present invention relates to reactive ion etching and more particularly to a system for preventing the propagation of plasma discharge down the gas feed path in such a system.

In the manufacture of semi-conductor integrated circuits, reactive ion etching (RIE) is coming into increased use for etching semi-conductor wafers to form thereon the patterns desired for circuit components. As the material being etched is typically in the form of a semi-conductor wafer which is thin and flat, it is desirable to energize the plasma by means of an electrode which is adjacent the wafer and through which the gas is introduced, e.g., through a series of openings in the electrode in the manner of a showerhead. To energize the plasma, a high voltage radio frequency (RF) signal is applied to the electrode. As the power levels used for etching have increased, one problem of which has developed is that the plasma discharge tends to propagate down the gas feed system. The gas feed system, including the usual gas pressure regulating system, is preferably grounded and thus potential gradients exists in the feed system which tend to generate plasma discharges just as they are created in the reactive ion etch chamber itself. Such propagation of the plasma discharge is undesirable, not only for the reason that it wastes RF power, but also in that the discharge can erode and damage the feed components and introduce contaminants into the process chamber. As is understood, the fabrication of integrated circuits demands exceptional purity and an avoidance of contaminants.

Among the several objects of the present invention, it may be noted the provision of a novel system for feeding gas to a reactive ion etch system; the provision of such a system in which propagation of the plasma discharge into the gas feed is eliminated, the provision of such a system which permits substantially unimpeded gas flow into the reaction chamber; the provision of such a system which facilitates the regulation of gas pressure by means outside the chamber; the provision of such a system which minimizes damage and contamination due to plasma discharges outside the reaction chamber; and the provision of such a system which is highly reliable and which is of relatively simple and inexpensive construction. Other objects and features will be in part apparent and in part pointed out hereinafter.

SUMMARY OF THE INVENTION

In accordance with the practice of the present invention, the potential gradient between the electrode in a reactive ion etch system and the gas feed is confined to a specified volume which is filled with a porous insulating material in which the pore size is too small to support a discharge, i.e. the pore size corresponds to the mean free electron path in the gas. In particular, the system includes a hollow insulating holder. At one end of the holder a porous metal plug is provided which is in contact with the electrode and, at the other end of the holder, a second porous metal plus is provided through which gas is fed from feed line. Filling the space between the conductive plugs is a porous insulating material in which the individual pore sizes are too small to support discharge, i.e. the pore size corresponds to the mean free electron path in the gas.

BRIEF DESCRIPTION OF THE DRAWING

FIG. 1 as a diagrammatic illustration of a reactive ion etch system provided with a gas feed system constructed in accordance with the present invention;

FIG. 2 is a top view of a plasma arrester device employed in the gas feed system of FIG. 1; and FIG. 3 is a sectional view of the plasma arrester device.

Corresponding reference characters indicate corresponding parts throughout the several views of the drawings.

DESCRIPTION OF THE PREFERRED EMBODIMENT

Referring now to FIG. 1, a chuck for holding a semiconductor wafer to be etched is shown diagrammatically at 11. A semiconductor wafer 13 is held to the chuck by means of a clamp ring 15. Preferably the plasma generating apparatus is of the balanced RF type in which the chuck itself constitutes one electrode of the discharge system. In such case, the clamp ring 15 is preferably constructed of an insulating material. Overlying the wafer is a second electrode 17 through which the etching gas is fed through a shower head-like arrangement of openings 21 in a diffuser plate 22. Out-of-phase RF potentials are applied to the chuck 11 and electrode 17 from an RF power source through a suitable balancing network. A grounded diffusing screen is preferably provided between out-of-phase electrodes, as indicated at 31. The chuck 11 and electrode 17 are supported, by means of insulating rings 12 and 14, on an overall housing, indicated generally at 16. An exhaust port is provided at 18, through which reaction products are evacuated.

The desired plasma gas, obtained from a suitable pressurized source, is fed through a pressure regulator 33 and metallic supply line 35 to a plasma arrester 41 mounted on electrode 21. The plasma arrester is illustrated in greater detail in FIGS. 2 and 3. Each of the plasma forming electrodes 11 and 17 is surrounded by a suitable grounded housing 36 and 38, respectively, the ends of which are provided with coaxial RF feed lines, as indicated at 37 and 39, respectively. As indicated previously, the gas source, through to the metallic supply line, is preferably also maintained at ground potential.

Referring now to FIGS. 2 and 3, the plasma arrester 41 comprises a hollow insulating cylinder 43 constructed of a suitable insulating material such as a high molecular weight polyethylene. At one end of the cylinder is a porous metal plug 45 which contacts the electrode 17. At the other end of the cylinder is a second porous metal plug 47 similar to the first. A metal fitting or coupling 48 is provided for connection to the feed line 35 and this coupling contacts and holds the second metal plug 47 so as to maintain it at ground potential. The porous metal plugs 45 and 47 are preferably constructed of foam aluminum of the type sold under the trade name DUOCEL by Energy Research and Generation, Inc. of Oakland, Calif.

By means of this structure, the RF potential drop between the electrode 21 and ground is confined to a specific region within the gas feed system. The volume in this region, i.e., between the plugs 45 and 47, is filled with a porous insulating material 50 in which the pore sizes are too small to support discharge, i.e. they correspond approximately to the mean free electron path length of the gases used for reactive ion etching of semiconductor wafers. A filling of 1 mm diameter glass beads has been found highly effective for the porous insulating material. These beads flow easily and can thus completely fill the volume between the plugs, i.e. the space across which the potential drop occurs. Further, such beads provide the desirably small interstitial spacing which prevents the initiation or propagation of plasma discharge in the gas even though the electric field gradients and gas pressures are appropriate for and conducive to such discharge. At the same time, gas flow is relatively uninhibited so that there is no significant pressure drop across the arrester. Accordingly, pressure conditions within the reaction chamber can be determined by means of the external pressure regulating apparatus indicated at 33, even though this regulating apparatus is at ground potential.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. In a system for etching semi-conductor wafers by means of reactive ions in a gas plasma, the plasma being energized by an electrode which is adjacent the wafer and through which the gas is introduced, a gas feed comprising
   a gas feed line which is electrically grounded;
   a hollow insulating housing;
   at one end of said housing, a porous metal plug which is in contact with said electrode;
   at the other end of said housing; a second porous metal plug through which gas is fed from said feed line;
   filling the space between said plugs, a porous insulating material.

2. In a system for etching semi-conductor wafers by means of reactive ions in a gas plasma, the plasma being energized by an electrode which is adjacent the wafer and through which the gas is introduced, a gas feed comprising
   a gas feed line which is electrically grounded;
   a hollow insulating cylinder;
   at one end of said cylinder, a porous metal plug which is in contact with said electrode;
   at the other end of said cylinder; a second porous metal plug through which gas is fed from said feed line;
   filling the space between said plugs, a porous particulate insulating material in which the pore size between the particles corresponds to the mean free electron path in said gas.

3. A gas feed as set forth in claim 2 wherein said particulate insulating material comprises glass beads.

4. A gas feed as set forth in claim 3 wherein said glass beads have a diameter of about one millimeter.

5. A gas feed as set forth in claim 4 wherein said insulating cylinder is constructed of polyethylene.

6. In a system for etching semi-conductor wafers by means of reactive ions in a gas plasma, the plasma being energized by an electrode which is adjacent the wafer and through which the gas is introduced, a gas feed comprising
   a gas feed line which is electrically grounded;
   a hollow cylinder constructed of an insulating synthetic resin;
   at one end of said cylinder, a porous metal plug which is in contact with said electrode;
   at the other end of said cylinder; a second porous metal plug through which gas is fed from said feed line;
   filling the space between said plugs with a mass of glass beads.

7. A gas feed as set forth in claim 6 wherein said porous metal plugs are made of aluminum foam.

8. A gas feed as set forth in claim 7 wherein the diameter of said glass beads is about one millimeter.

* * * * *